US005329419A

United States Patent [19]
Umezawa

[11] Patent Number: 5,329,419
[45] Date of Patent: Jul. 12, 1994

[54] INTEGRATED CIRCUIT PACKAGE HAVING A COOLING MECHANISM

[75] Inventor: Kazuhiko Umezawa, Tokyo, Japan
[73] Assignee: NEC Corporation, Tokyo, Japan
[21] Appl. No.: 964,028
[22] Filed: Oct. 21, 1992

[30] Foreign Application Priority Data

Oct. 21, 1991 [JP] Japan .................................. 3-272631

[51] Int. Cl.$^5$ ............................................. H05K 7/20
[52] U.S. Cl. .................................... 361/699; 165/80.4; 165/185; 361/704
[58] Field of Search .............................. 165/80.3–80.4, 165/185; 361/381–382, 385–389

[56] References Cited

U.S. PATENT DOCUMENTS

| | | |
|---|---|---|
| 3,586,101 | 6/1971 | Chu et al. . |
| 3,774,677 | 11/1973 | Antonetti et al. . |
| 3,908,188 | 9/1975 | Kawamoto . |
| 4,226,281 | 10/1980 | Chu . |
| 4,245,273 | 1/1981 | Feinberg et al. . |
| 4,381,032 | 4/1983 | Cutchaw . |
| 4,644,385 | 2/1987 | Nakanishi et al. . |
| 4,686,606 | 8/1987 | Yamada et al. . |
| 4,712,158 | 12/1987 | Kikuchi et al. . |
| 4,748,495 | 5/1988 | Kucharek . |
| 4,750,086 | 6/1988 | Mittal . |
| 4,759,403 | 7/1988 | Flint et al. ......................... 165/80.4 |
| 4,783,721 | 11/1988 | Yamamoto et al. . |
| 4,791,983 | 12/1988 | Nicol et al. . |
| 4,809,134 | 2/1989 | Tustaniwskyj et al. . |
| 4,884,167 | 11/1989 | Mine . |
| 4,897,762 | 1/1990 | Daikoku et al. . |
| 4,942,497 | 7/1990 | Mine et al. . |
| 5,023,695 | 6/1991 | Umezawa et al. . |

FOREIGN PATENT DOCUMENTS

| | | |
|---|---|---|
| 60-160150 | 8/1985 | Japan . |
| 61-226946 | 10/1986 | Japan . |
| 61-276242 | 12/1986 | Japan . |
| 63-81959 | 4/1988 | Japan . |
| 63-226049 | 9/1988 | Japan . |

OTHER PUBLICATIONS

Cannistra et al "Module Board Service Frame", IBM Tech Disclosure Bulletin, vol. 22, No. 2, Jul. 1979, pp. 688–689.
Pascuzzo et al, "Integrated Circuit Module Package Cooling Structure", IBM Tech Disclosure Bulletin, vol. 20, No. 10, Mar. 1978, pp. 3898–3899.
IBM J. Res. Develop., vol. 26, No. 1, pp. 55–66 (Jan. 1982), "A Conduction-Cooled Module for High-Performance LSI Devices", Oktay, et al.
IBM Technical Disclosure Bulletin, vol. 20, No. 11A, Apr. 1978, "Conduction-Cooling Module", Hwang et al., pp. 4334–4335.
IBM Technical Disclosure Bulletin, vol. 21, No. 6, Nov. 1978, "Compliant Cold Plate Cooling Scheme", Antonetti et al., p. 2431.
IBM Technical Disclosure Bulletin, vol. 21, No. 6, Nov. 1978, "Solid Encapsulated Module", Chu et al., pp. 2435–2436.

Primary Examiner—Gregory D. Thompson
Attorney, Agent, or Firm—Burns, Doane, Swecker & Mathis

[57] ABSTRACT

An integrated circuit package having a cooling mechanism according to the present invention comprises a plurality of integrated chips disposed to make a matrix and coolers utilizing jet impingement of liquid coolant for cooling which are positioned corresponding to the integrated circuit chips on a printed circuit board using a holding plate and are pressed against the integrated circuit chips with force at a predetermined level. A cooler comprises a cooling plate in contact with a top face of the applicable integrated circuit chip, a cylinder-shaped housing fixed to the cooling plate, a nozzle inserted to the housing to jet the liquid coolant practically to the center of the cooling plate and a draining tube to drain the liquid coolant impinged into the housing. It further comprises a supplying manifold to distribute the liquid coolant supplied from outside to each of the coolers and a draining manifold to collect and drain the liquid coolant flowing from the rows of coolers, and connecting tubes to connect the supplying manifold and the draining manifold with the coolers and to connect adjacent coolers.

8 Claims, 7 Drawing Sheets

INTEGRATED CIRCUIT PACKAGE HAVING A COOLING MECHANISM

BACKGROUNDS OF THE INVENTION

1. Field of the Invention

The present invention relates to an integrated circuit package cooling mechanism used in electronic devices such as information processors, and particularly relates to a cooling device in an integrated circuit package comprising a plurality of integrated circuit chips disposed on a printed wiring board to make a matrix.

2. Description of the Prior Art

Figure 6:
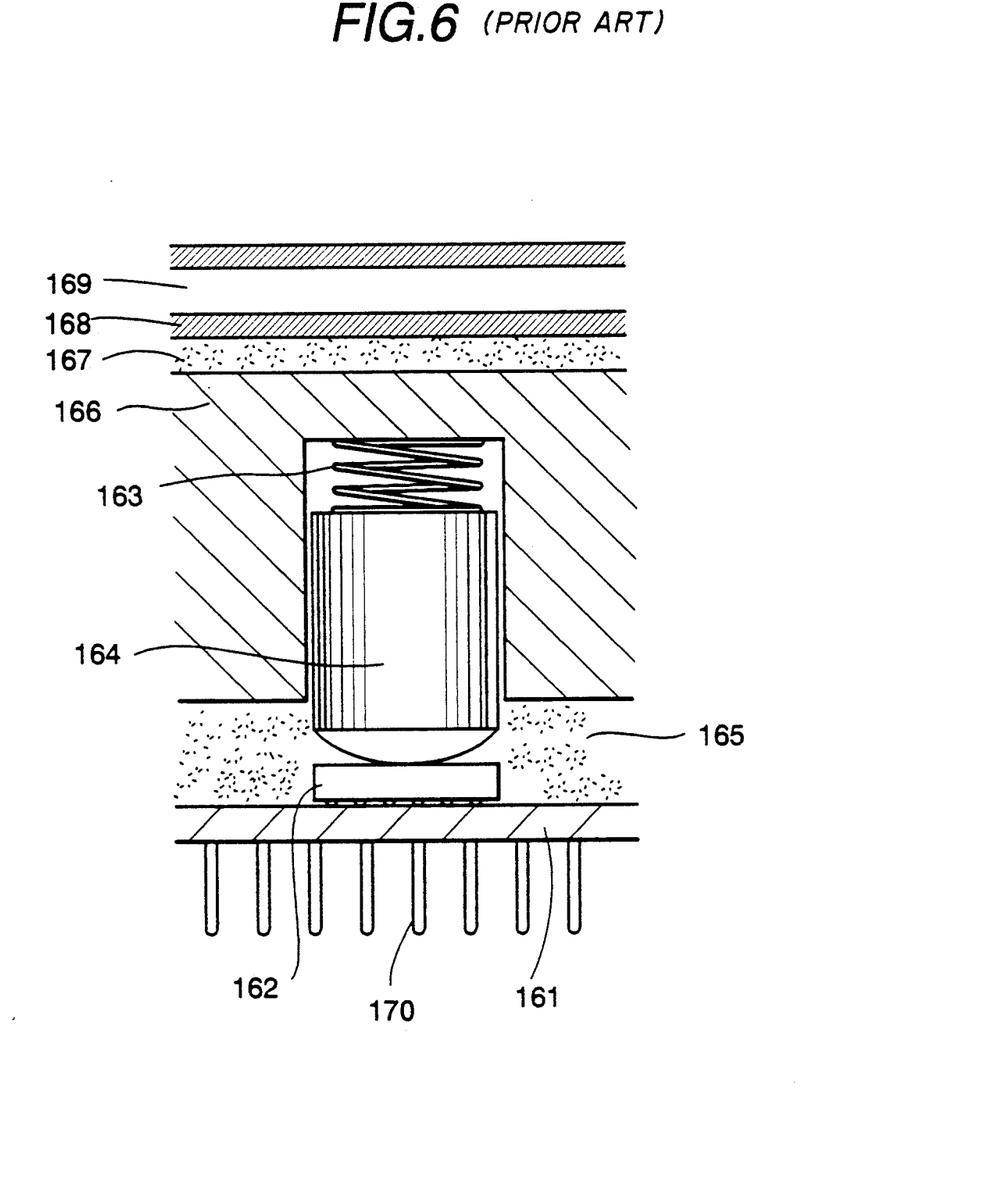
FIG. 6 is a cross sectional view of a cooling mechanism of a conventional integrated circuit chip.

An example of a conventional integrated circuit package cooling mechanism of this type is shown in FIG. 6. This is cited from "A Conduction-Cooled Module for High-Performance LSI Devices" by S. Oktay and H.C. Kammerer (IBM J/RES. DEVELOP. vol. 26, No. 1, Jan. 1982). In FIG. 6, a wiring substrate 161 is provided with an integrated circuit chip 162 mounted thereon, and a spring 163 presses a piston 164 against the chip so that the heat at the chip is transferred to a cooling plate 168 through a space filled with helium gas 165 and via a hat 166 and an intervening layer 167, and then discharged to a liquid coolant 169 circulating in the cooling plate 168. The reference numeral 170 indicates an I/O pin of the wiring substrate 161. Including this one, several cooling devices have been invented and put into practice.

Figure 7:
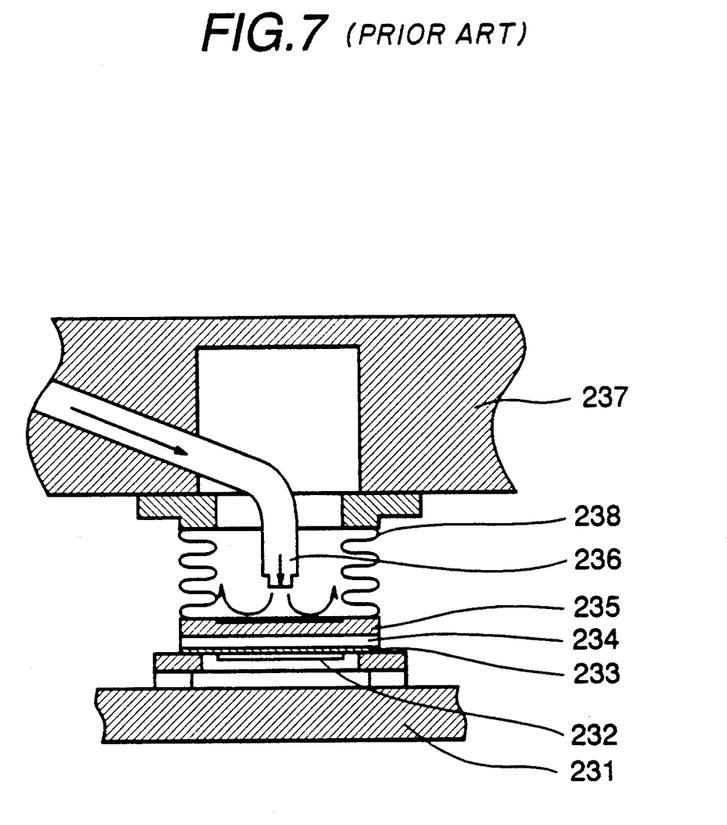
FIG. 7 is a cross sectional view of a cooling mechanism in another conventional integrated circuit chip.

The Japanese Patent Application Laid-open No. 60150/85 discloses a cooling device using impinging jet of liquid coolant. FIG. 7 shows the configuration of such a cooling device.

As shown in FIG. 7, this cooling device transfers the heat generated at a chip 232 mounted on a printed wiring board 231 to a heat transfer plate 235 via a heat transfer board 233 and a variable heat transfer substance 234, and cools down the heat transfer plate 235 by jet of the liquid coolant from a nozzle 236. The heat transfer plate 235 is pressed against the chip 232 by a bellows 238 fixed to a cooling header 237 via the variable heat transfer substance 234 and the heat transfer board 233.

Among conventional cooling mechanisms described above, the one shown in FIG. 6 has a coolant channel in its cooler plate designed for heat transfer by forced convection, but the heat transfer ratio obtained by this mechanism is about 0.1 to 0.5 W/cm$^2$ ° C. at most. This is not sufficient cooling capacity for an integrated circuit chip with higher integration. The mechanism in FIG. 7 can achieve a higher heat transfer ratio, but its thin bellows is susceptible to corrosive holes under the affect of liquid coolant, which may result in leakage of coolant.

SUMMARY OF THE INVENTION

It is a first object of the present invention to provide an integrated circuit package having a cooling mechanism which enables high cooling efficiency and high resistance to corrosion due to liquid coolant.

It is a second object of the present invention to provide an integrated circuit package having a cooling mechanism with reduced connections of the coolant channel with outside devices, which facilitates maintenance and replacement.

According to a preferred embodiment to attain the above objects, an integrated circuit package having a cooling mechanism of the present invention comprises a printed wiring board, a plurality of integrated circuit chips disposed on said printed wiring board, cooling means disposed corresponding to said integrated circuit chips for cooling down said integrated circuit chips using jet impingement of liquid coolant, a holding means fixed to said printed wiring board to position and hold said cooling means corresponding to said integrated circuit chips, and a pressing means to press said cooling means against said integrated circuit chips with force of a predetermined level.

According to another preferred embodiment, said cooling means comprises a cooling plate in contact with the top face of said integrated circuit chip, a cylinder-shaped housing with an end fixed to said cooling plate, a nozzle inserted into said housing to jet said liquid coolant to almost the center of said cooler plate, and a drain tube disposed at said housing to drain said liquid coolant jet into said housing.

According to further preferred embodiment, said holding means is designed to have positioning holes to hold said cooling means with their top parts projecting at the positions corresponding to said integrated circuit chips. In addition, a frame to support said printed wiring board is provided to fix the holding means thereto. Further, said pressing means comprises a spring disposed between said cooler and said holding means.

According to another preferred embodiment to attain the second object above, an integrated circuit package having a cooling mechanism of the present invention comprises a supplying manifold which is provided with an inlet for liquid coolant supplied from outside and distributes the liquid coolant to each row of cooling means, a draining manifold which collects liquid coolant flowing from said rows of cooling means and drain such liquid coolant to outside, and connecting tubes to connect said supplying manifold and draining manifold with the cooling means and to connect adjacent cooling means.

According to still another embodiment to attain the above objects, an integrated circuit package having a cooling mechanism comprises a printed wiring board, a plurality of integrated circuit chips disposed on said printed wiring board like a matrix, cooling means disposed corresponding to said integrated circuit chips for cooling down said integrated circuit chips using impinging jet of liquid coolant, a holding means fixed to said printed wiring board to position and hold said cooling means corresponding to said integrated circuit chips, a pressing means to press said cooling means against said integrated circuit chips with force of a predetermined level, a supplying manifold which is provided with an inlet for liquid coolant supplied from outside and distributes the liquid coolant to each row of cooling means, a draining manifold which collects the liquid coolant flowing from said rows of cooling means and is provided with an outlet to drain such liquid coolant, and connecting tubes to connect said supplying manifold and draining manifold with the rows of cooling means and to connect adjacent cooing means in each row.

According to another preferred embodiment of the present invention to attain the above objects, a cooling device in an integrated circuit package comprises cooling means which are disposed corresponding to a plurality of integrated circuit chips mounted on a printed wiring board in the integrated circuit package and cool down said integrated circuit chips using jet impingement of liquid coolant, a holding means fixed to said printed wiring board to position and hold said cooling means corresponding to said integrated circuit chips, a pressing means to press said cooling means against said integrated circuit chips with force of a predetermined level, a supplying manifold which is provided with an inlet for liquid coolant supplied from outside and distributes the liquid coolant to each row of cooling means, a draining manifold which collects the liquid coolant flowing from said rows of cooling means and is provided with an outlet to drain such liquid coolant, and connecting tubes to connect said supplying manifold and draining manifold with the rows of cooling means and to connect adjacent cooing means in each row.

Other objects, characteristics and effects of the present invention will be clarified in the detailed description below.

DESCRIPTION OF THE PREFERRED EMBODIMENT

Figure 1:
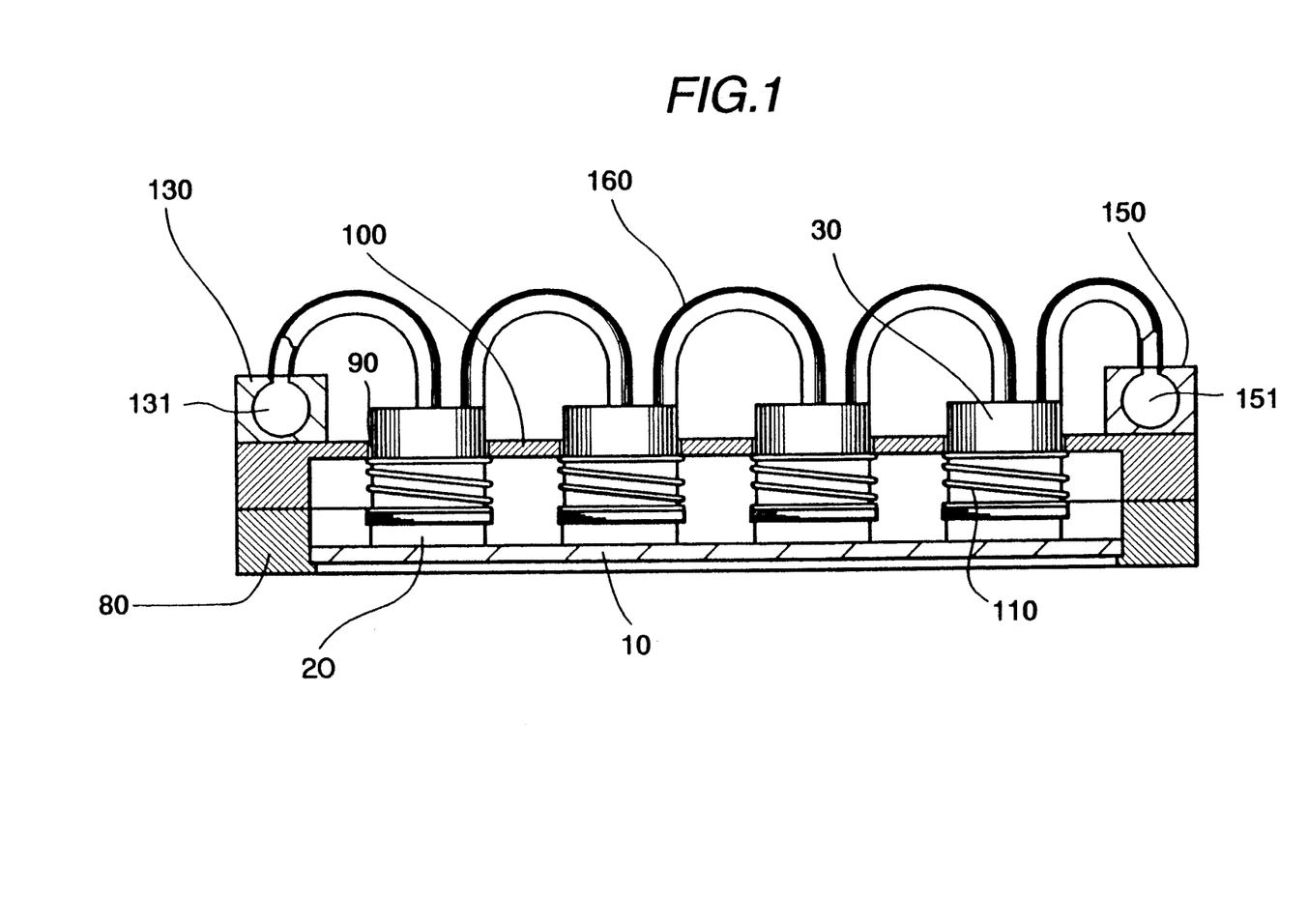
FIG. 1 is a cross sectional view to show a cooling mechanism for an integrated circuit package according to an embodiment of the present invention.
Figure 2:
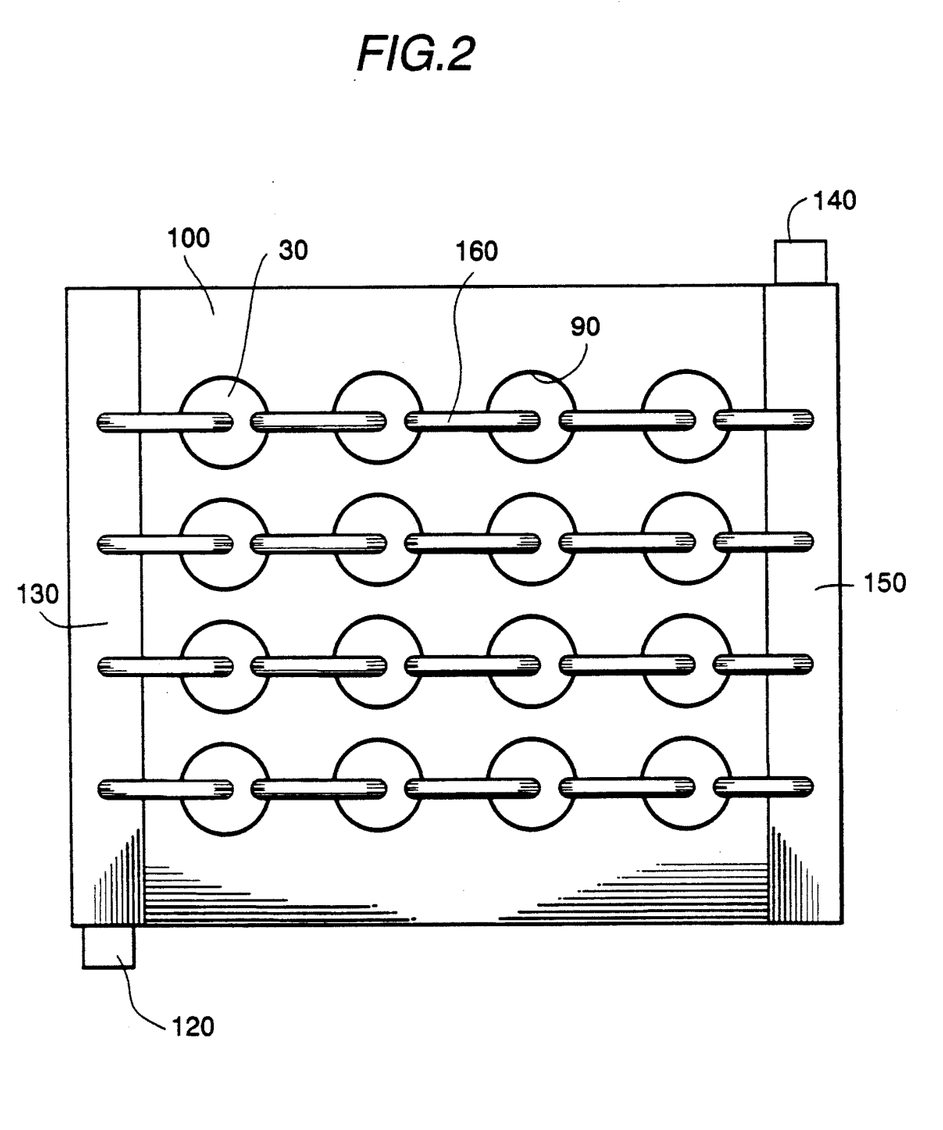
FIG. 2 is a plan view of a cooling mechanism for an integrated circuit package according to an embodiment of the present invention.

Referring to the attached figures, preferred embodiments of an integrated circuit package having a cooling mechanism of the present invention will be described below. FIG. 1 is a cross sectional view of an integrated circuit package having a cooing mechanism according to an embodiment of the present invention. FIG. 2 is a plan view of that integrated circuit package.

An integrated circuit package has a printed wiring board 10 with a plurality of integrated circuit chips (ICs or LSIs) 20 disposed like a matrix thereon. Each integrated circuit chip 20 is provided with a corresponding cooler 30 which cools down the applicable integrated circuit chip 20 utilizing jet impingement of liquid coolant such as water.

Figure 3:
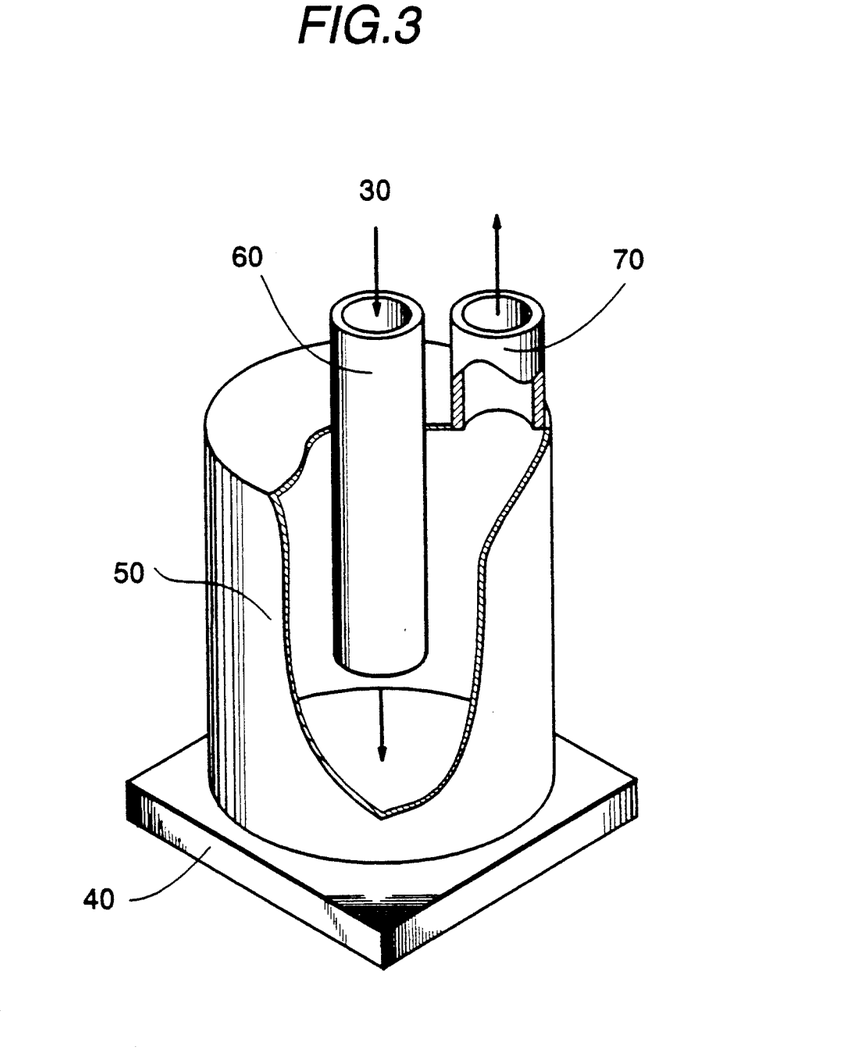
FIG. 3 is a partially cut off perspective view of a cooler in a cooling mechanism for an integrated circuit package according to an embodiment of the present invention.

A cooler 30 is designed to have relatively thick walls of highly corrosion-resistant metal such as copper in order for high corrosion resistance to liquid coolant. The cooler 30 is, as shown in FIG. 3, provided with a cooling plate 40, a housing 50, a nozzle 60 and a drain tube 70.

The cooling plate 40 is square-shaped and makes contact with the top face of the integrated circuit chip 20. The housing is formed as a cylinder with an end closed, and the open end is fixed to the cooling plate 40. The nozzle 60 to jet the supplied liquid coolant into the housing 50 is positioned so as to vertically go into the inside of the housing 50 through the top plate practically at the center. The leading end of the nozzle 60 is directed to the center of the cooler plate 40 so that the jet of the liquid coolant collides with the center part of the cooler plate 40. The leading end of the nozzle 60 and the cooler plate 40 is designed to be separated for a distance to allow impingement jet of liquid coolant with sufficient force. In this embodiment, this distance is substantially the same as the diameter of the nozzle 60 or twice the diameter of the nozzle 60.

The drain tube 70 is to drain the liquid coolant jet from the nozzle 60 into the housing 50 and is placed at the periphery of the top plate of the housing 50 as shown in the figure. The above nozzle 60 and the drain tube 70 are also made of metal such as copper or other corrosion-resistant material.

The printed wiring board 10 is provided with a frame 80. The frame 80 is, as shown in FIG. 1, formed as a shallow box which can accommodate the printed wiring board 10. The frame 80 is butt against and fixed to a holding plate 100 having substantially the same contour as the frame 80. The holding plate 100 has a plurality of positioning holes 90 to allow the top of the coolers 30 to project outward. The positioning holes 90 are provided corresponding to the disposition of the integrated circuit chips 20 on the printed wiring board 10 so that each cooler 30 can be positioned to corresponding integrated circuit chip 2.

As shown in FIG. 1, the housing 50 of the cooler 30 is wound by a coil spring 110. The coil spring 110 intervenes between the cooling plate 40 and the holding plate 100. The elasticity of the coil spring 110 serves for maintaining the force pressing the cooling plate 40 of the cooler 30 against the integrated circuit chip 20 at a fixed level.

The holding plate 100 is, at its ends, provided with a supplying manifold 130 to distribute the liquid coolant to each row of coolers 30 and a draining manifold 150 to collect the liquid coolant flowing out of the rows of coolers for draining. The supplying manifold 130 and the draining manifold 150 are mounted perpendicular to the cooler disposition direction (horizontal direction in FIG. 2). The supplying manifold 130 has a channel 131 inside and an inlet 120 for liquid coolant supplied from outside at an end. The draining manifold 150 has a channel 151 inside and an outlet 140 for draining of liquid coolant to outside.

The supplying manifold 130 and the nozzle 60 of the first cooler 30 at each cooler row as well as the drain tube 70 of the last cooler 30 at each cooler row and the draining manifold 150 are connected with U-shaped connecting tubes 160. In addition, the drain tube 70 and the nozzle 60 of the adjacent coolers 30 are also connected by connecting tubes 160.

Figure 4:
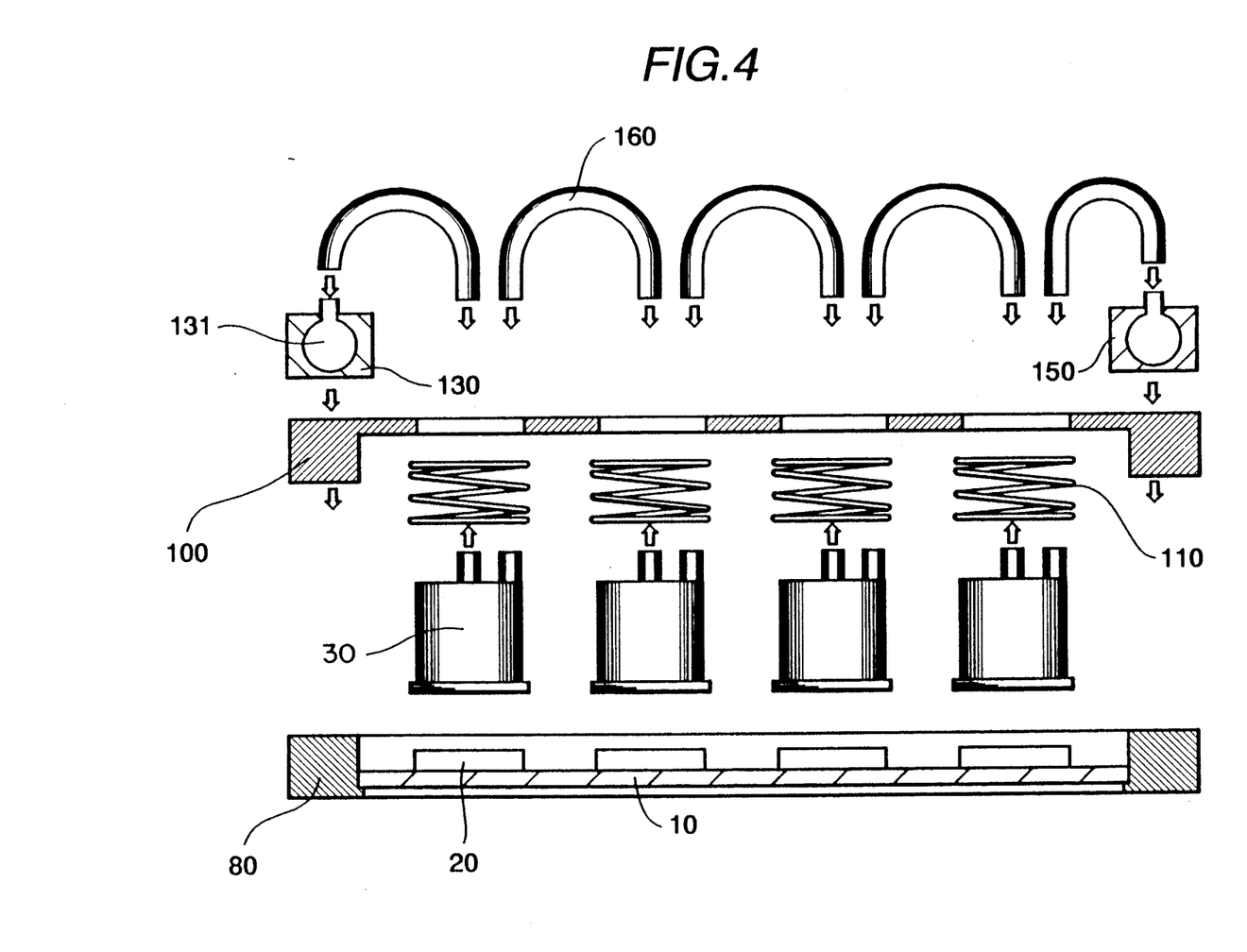
FIG. 4 is a breakdown diagram to illustrate the assembling procedure of an integrated circuit package according to an embodiment of the present invention.

Now referring to FIG. 4, the procedure to assemble an integrated circuit package cooling device as above is described.

Each of the coolers 30 is inserted into a coil spring 110 and further inserted through the applicable positioning hole 90 of the holding plate 100 so as to have the top of the cooler 30 projecting from the positioning hole 90.

Then, a supplying manifold 130 and a draining manifold 150 are fixed on the top of the ends of the holding plate 100. The supplying manifold 130 is connected with the first cooler of each row and the last cooler 30 of each row is connected with the draining manifold 150 with connecting tubes 160. Adjacent coolers 30 in each row are also connected with connecting tubes 160.

Finally, the holding plate 100 arranged as above is fixed to the frame 80 placed on the printed wiring board 10 with integrated circuit chips 20 mounted thereon. Thus, an integrated circuit package having a cooling device is completed.

Figure 5:
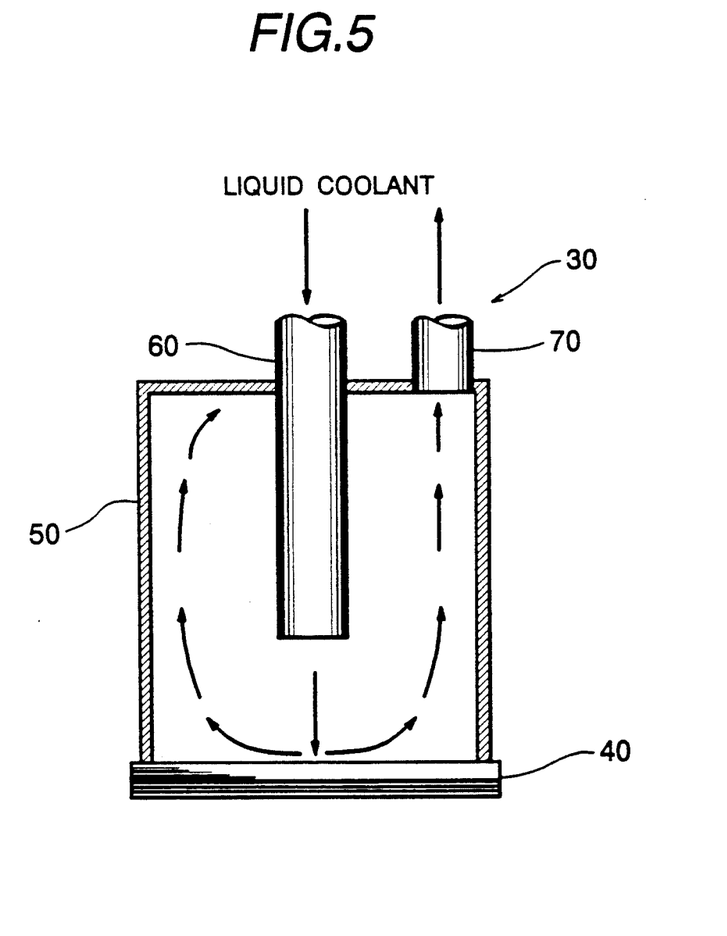
FIG. 5 is a cross sectional view to show the flow of the liquid coolant in a cooler according to an embodiment of the present invention.

In the cooling mechanism of an integrated circuit package configured as above, the liquid coolant led from the inlet 120 at the supplying manifold 130 flows in the channel 131 of the supplying manifold 130 and the connecting tubes 160 and is distributed to the first coolers 30 in the rows of coolers. The liquid coolant is impinged from the nozzle 60 and collides with the center part of the cooler plate 40, and with absorbing heat from the cooling plate 40, flows through the drain tube 7 and the connecting tubes 160 to go into the adjacent cooler 30. FIG. 5 shows the flow of the liquid coolant in a cooler 30. Then, the liquid coolant flowing out of the last cooler 30 of each cooler row is, via connecting tubes 160, collected to the draining manifold 150 and is drained to outside through the channel 151 and the outlet 140.

On the other hand, the heat generated at the integrated circuit chip 20 is transferred to the cooling plate 40 of the cooler 30 provided for each chip. The cooling plate 40 where the liquid coolant jet from the nozzle 60 makes collision serves for cooling at a high heat transfer coefficient so that the heat generated at the integrated circuit chip 20 is discharged to the liquid coolant.

According to experiments, if water is used as the liquid coolant in the cooling device according to this embodiment, the heat transfer ratio between the cooler plate 40 and the liquid coolant can be as high as $1 W/cm^2 \cdot °C.$ or more. At the same time, the thermal resistance from the integrated circuit chip 20 to the liquid coolant can be suppressed as low as $1 °C./W$ or less.

Besides, this mechanism where the cooler 30 is pressed against the integrated circuit chip 20 by the coil spring 110 realizes high cooling efficiency. In addition, since the cooler 30 itself is not required to be flexible, the cooling plate 40 and the housing 50 constituting the cooler 30 can have thick walls. Thus, the cooling mechanism can be highly resistant to corrosion caused by the liquid coolant.

Further, since the liquid coolant is distributed and collected by the supplying manifold 130 and the draining manifold 150 in this mechanism, connections with outside coolant channel can be limited to only two: the inlet at the supplying manifold 130 and the outlet 140 at the draining manifold 150. This facilitates maintenance and replacement during mounting and removal of the integrated circuit package thanks to reduced connections with the coolant channel.

Obviously, various modifications can be made to the above embodiment. For example, the housing 50 has a cylinder shape in the above embodiment, but its cross section can be a square or any other shape. A straight nozzle 60 is placed to vertically go through the top plate of the housing 50 at the center in the above embodiment, but the nozzle 60 can be placed at any position and can be of any shape provided that its leading end is positioned toward the center of the cooling plate 40. For example, an L-shaped nozzle 60 may come through the side plate of the housing 50. In the above embodiment, integrated circuit chips are disposed on a printed wiring board like a matrix, but the present invention is applicable to any board with a plurality of integrated circuit chips and it is not limited to a matrix disposition of the chips.

It is intended to cover in the appended claims all such modifications as fall within the true spirit and scope of the invention.

What is claimed is:

1. An integrated circuit package having a cooling mechanism, comprising:
   a printed wiring board;
   a plurality of integrated circuit chips disposed on said printed wiring board;
   cooling means disposed corresponding to said integrated circuit chips for cooling said integrated circuit chips using impinging jet of liquid coolant, wherein said cooling means comprises
   a cooling plate in contact with the top face of a respective integrated circuit chip,
   a cylinder-shaped housing with an end fixed to said cooling plate,
   a nozzle inserted into said housing to impinge said liquid coolant to substantially the center of said cooling plate, and
   a drain tube disposed to drain said liquid coolant from said housing;
   holding means in fixed relationship to said printed wiring board for positioning and holding said cooling means corresponding to said integrated circuit chips, wherein said holding means has positioning holes to hold said cooling means with top parts of said cooling means projecting at positions corresponding to said integrated circuit chips; and
   pressing means to press said cooling means against said integrated circuit chips with force of a predetermined level.

2. An integrated circuit package having a cooling mechanism of claim 1, further comprising a frame to support said printed wiring board wherein said holding means is fixed to said frame.

3. An integrated circuit package having a cooling mechanism of claim 1, wherein said pressing means comprises a spring disposed between said cooling means and said holding means.

4. An integrated circuit package having a cooling mechanism of claim 1, further comprising;
   a supplying manifold, which is provided with an inlet for liquid coolant supplied from outside said integrated circuit package, for distributing the liquid coolant to each of rows of cooling means;
   a draining manifold which collects liquid coolant flowing from said rows of cooling means and drain such liquid coolant to outside said integrated circuit package; and
   connecting tubes to connect said supplying manifold and draining manifold with the cooling means and to connect adjacent cooling means in each row.

5. An integrated circuit package having a cooling mechanism, comprising;
   a printed wiring board;
   a plurality of integrated circuit chips disposed on said printed wiring board in a matrix;
   cooling means, disposed corresponding to said integrated circuit chips, for cooling said integrated circuit chips using jet impingement of liquid coolant, wherein said cooling means comprises
   a cooler plate in contact with the top face of a respective integrated circuit chip, a cylinder-shaped housing with an end fixed to said cooler plate, a nozzle inserted into said housing to jet said liquid coolant to substantially the center of said cooler plate, and a drain tube disposed at said housing to drain said liquid coolant jet into said housing;

holding means, in fixed relationship to said printed wiring board, for positioning and holding said cooling means corresponding to said integrated circuit chips, wherein said holding means has positioning holes to hold said cooling means with their top part projecting at the positions corresponding to said integrated circuit chips;

pressing means for pressing said cooling means against said integrated circuit chips with force of a predetermined level;

a supplying manifold which is provided with an inlet for liquid coolant supplied from outside said integrated circuit package and distributes the liquid coolant to each row of cooling means;

a draining manifold which collects the liquid coolant flowing from said rows of cooling means and is provided with an outlet to drain such liquid coolant; and connecting tubes to connect said supplying manifold and draining manifold with the rows of cooling means and to connect adjacent cooling in each row.

6. An integrated circuit package having a cooling mechanism of claim 5, further comprising a frame to support said printed wiring board wherein said holding means is fixed to said frame.

7. A cooling device in an integrated circuit package, comprising;

cooling means, which are disposed corresponding to a plurality of integrated circuit chips mounted on a printed wiring board in an integrated circuit package, for cooling said integrated circuit chips using jet impingement of liquid coolant, wherein said cooling means comprises a cooling plate in contact with the top face of a respective integrated circuit chip, a cylinder-shaped housing with an end fixed to said cooling plate, a nozzle inserted into said housing to impinge said liquid coolant to substantially the center of said cooler plate, and a drain tube disposed at said housing to drain said liquid coolant jet into said housing;

holding means, in fixed relationship to said printed wiring board, for positioning and holding said cooling means corresponding to said integrated circuit chips wherein said holding means has positioning holes to hold said cooling means with their top part projecting at the positions corresponding to said integrated circuit chips;

pressing means for pressing said cooling means against said integrated circuit chips with force of a predetermined level;

a supplying manifold which is provided with an inlet for liquid coolant supplied from outside said integrated circuit package for distributing the liquid coolant to each row of cooling means;

a draining manifold which collects the liquid coolant flowing from said rows of cooling means and is provided with an outlet to drain such liquid coolant; and connecting tubes to connect said supplying manifold and draining manifold with the rows of cooling means and to connect adjacent cooling means in each row.

8. An integrated circuit package having a cooling mechanism of claim 7, further comprising a frame to support said printed wiring board wherein said holding means is fixed to said frame.

* * * * *